United States Patent
Anderson et al.

(10) Patent No.: US 6,948,556 B1
(45) Date of Patent: Sep. 27, 2005

(54) HYBRID LOOP COOLING OF HIGH POWERED DEVICES

(76) Inventors: William G. Anderson, 1791 Middlebrook Rd., Bound Brook, NJ (US) 08805; G. Yale Eastman, 257 Brook Farms Rd., Lancaster, PA (US) 17601; David B. Sarraf, 303 Arch St., Elizabethtown, PA (US) 17022; Jon Zuo, 1030 Lehn Dr., Lancaster, PA (US) 17601

( * ) Notice: Subject to any disclaimer, the term of this patent is extended or adjusted under 35 U.S.C. 154(b) by 23 days.

(21) Appl. No.: 10/706,017

(22) Filed: Nov. 12, 2003

(51) Int. Cl.$^7$ .............................................. F28D 15/04
(52) U.S. Cl. ............................... 165/80.4; 165/104.26; 165/104.33
(58) Field of Search .................... 165/80.4, 104.26, 165/104.22, 104.33; 257/715; 361/700

(56) References Cited

U.S. PATENT DOCUMENTS

| | | | | |
|---|---|---|---|---|
| 4,470,450 A | | 9/1984 | Bizzell et al. | 165/104.25 |
| 4,515,207 A | | 5/1985 | Alario et al. | 165/1 |
| 4,825,661 A | * | 5/1989 | Holtzapple et al. | 165/104.26 |
| 4,854,379 A | * | 8/1989 | Shaubach et al. | 165/104.26 |
| 4,898,231 A | | 2/1990 | Miyazaki | 165/13 |
| 5,535,818 A | * | 7/1996 | Fujisaki et al. | 165/104.33 |
| 5,944,092 A | | 8/1999 | Van Oost | 165/104.26 |
| 6,209,626 B1 | | 4/2001 | Bhatia | 165/104.25 |
| 6,382,309 B1 | | 5/2002 | Kroliczek et al. | 165/104.26 |
| 6,810,946 B2 | * | 11/2004 | Hoang | 165/104.26 |
| 2004/0104012 A1 | * | 6/2004 | Zhou et al. | 165/104.26 |
| 2004/0182550 A1 | * | 9/2004 | Kroliczek et al. | 165/104.26 |

OTHER PUBLICATIONS

J.H. Ambrose et al., "Two Phase Survivable Thermal Management—Heat Acquisition and Transport Components," Lockheed Missles and Space Company Inc. 1992 SAE.

* cited by examiner

*Primary Examiner*—Teresa J. Walberg
(74) *Attorney, Agent, or Firm*—Anthony Colesanti

(57) ABSTRACT

A heat transfer loop system includes a primary passive two-phase flow segment with an evaporator, a condenser and a liquid reservoir, and a secondary actively pumped liquid flow segment in which the liquid in the reservoir is drawn by a liquid pump into the evaporator, where a portion of the liquid is vaporized by the heat input and moves into the primary segment while the excess liquid is pumped back to the reservoir. The evaporator consists of a porous wick and one or more liquid arteries encased in the porous wick. The liquid arteries have porous walls to allow liquid phase working fluid to flow into the surrounding porous wick. The liquid arteries have porous walls to allow liquid phase working fluid to flow into the surrounding porous wick. The excess liquid continues to move through the arteries and eventually out of the evaporator and into the reservoir. The porous wick provides sufficient capillary force to separate the liquid inside the arteries and the vapor in the evaporator.

41 Claims, 15 Drawing Sheets

HYBRID LOOP COOLING OF HIGH POWERED DEVICES

BACKGROUND OF THE INVENTION

1. Field of the Invention

The present invention relates to heat transfer devices, and more particularly, to a hybrid heat transfer loop system that consists of both capillary driven two-phase flow and actively pumped liquid flow segments.

2. Description of Prior Art

Attaching a heat pipe to a waste heat generating component such as an integrated circuit is a known and successful technique of moving the undesired waste heat away from that electronic component. One portion of the heat pipe is exposed to the heat source and another portion of the heat pipe is exposed to a heat sink, which is at a lower temperature than the heat source. Heat is absorbed from the heat source by evaporation of a liquid-phase working fluid inside the heat pipe at the portion exposed to the heat source (the evaporator). The vapor phase working fluid with its absorbed heat load (latent heat of vaporization) is thermodynamically driven to the portion of the heat pipe exposed to the heat sink, due to the pressure gradient caused by the temperature difference between the heat source and the heat sink. The heat load is transferred by the working fluid to the heat sink, with consequent condensation of the vapor phase working fluid at the portion of the heat pipe exposed to the heat sink (the condenser). Then, driven by the capillary force developed in a capillary structure inside the heat pipe, the condensed working fluid is returned in liquid phase to the evaporator portion of the heat pipe through the capillary structure. The heat pipe is often referred as a passive heat transfer device, due to the fact that its operation is driven by the heat input instead of electrical or mechanical energy.

The capillary structure is typically an elongated wick structure extending for substantially the full length of the heat pipe. Wick structures may include interior longitudinal grooves, roughened interior surfaces, or mesh screens or bonded powders joined to the interior surface of the heat pipe. The capillary limit of a heat pipe is reached when the maximum capillary force available in the wick is not able to overcome the total pressure drop of the liquid and vapor flows inside the heat pipe and the gravity or acceleration effects on the liquid-phase working fluid.

One shortcoming of the heat pipe is that its heat transport capability and heat carrying distance are limited by the capillary limit in the wick structure, which is sensitive to the orientation and magnitude of the gravity. In addition, a high heat flux input at the evaporator presents another significant problem to the heat pipe operation. Heat flux is a commonly used terminology to describe the thermal power density, which has a unit of watt per square centimeter (W/cm$^2$). Modern computer chips typically generate waste heat fluxes on the order of 15 to 50 W/cm$^2$. Next generation power and opto electronics may produce waste heat fluxes in excess of 1,000 W/cm$^2$. The increasing heat flux may cause boiling inside the wick structure in the evaporator portion of the heat pipe, disrupting the returning liquid flow and consequently causing dry-out in the evaporator.

Some prior art approaches to improving the heat carrying capacity of heat pipes include the use of elongated arterial passages along an interior wall of the heat pipe. Examples of such configurations can be found in U.S. Pat. Nos. 4,470,450 and 4,515,207, the disclosures of which are hereby incorporated by reference, in their entirety. In principle, the pressure drop of the liquid flow through the arteries is substantially smaller than through the wick interiors. The reduced liquid pressure drop results in an increase in the liquid flow rate and consequently in heat transport capability and heat carrying distance. However, these arteries are susceptible to boiling at high heat flux conditions, wherein the resultant vapor bubbles can interrupt or block the capillary driven liquid flow through the arteries, resulting in system failures.

Other prior art approaches to improving the heat carrying capacity of heat pipes include the use of separate liquid and vapor transport lines to link the evaporator and condenser. These devices are typically called loop heat pipes or capillary pumped loops, depending on the detailed design configuration. Examples of the loop heat pipe and capillary pumped loop configurations can be found in U.S. Pat. Nos. 6,382,309 and 5,944,092, the disclosures of which are hereby incorporated by reference, in their entirety. The separation of the liquid and vapor lines allows the use of very fine pore wicks in the evaporator portion only, which substantially increases the capillary force in the wick and reduces the pressure drops of the liquid and vapor flows. Typical loop heat pipes and capillary pumped loops can carry significantly more heat over far greater distances than typical heat pipes. In addition, the operations of loop heat pipes and capillary pumped loops have reduced sensitivity to the gravity and acceleration, since the capillary force in the fine pore wicks in the evaporator is far greater than the gravity and acceleration effects.

Loop heat pipes and capillary pumped loops have very limited capabilities of handling high heat flux input. The vapor evaporated from the wick in the evaporator of a loop heat pipe or capillary pumped loop is directly exposed to the heat input before vented to the vapor transport line. The resultant vapor superheating substantially reduces the heat transfer efficiency and limits the heat flux capacity of the loop heat pipe and capillary pumped loop. Typical loop heat pipes and capillary pumped loops cannot handle heat fluxes higher than 20 W/cm$^2$. Some advanced designs have demonstrated close to 100 W/cm$^2$ heat flux capacity in a laboratory setting.

Some prior art approaches to simultaneously obtaining large heat carrying capacity and high heat flux capacity include the use of liquid pumps to replace or supplement the capillary force as the mechanism to return the liquid working fluid to the evaporator. Spray nozzles have also been used to supply liquid to the evaporator and produce a thin film evaporation mode. In either scenario, however, the inability to precisely regulate liquid flow to the evaporator can result in an excess liquid supply to the evaporator, also known as "flooding," which results in decreased heat transfer performance. Elaborate control schemes involving a complex network of valves and sensors are sometimes used to regulate the liquid supply to the evaporator to prevent flooding. In addition, spray cooling systems are generally prone to clogging in the nozzles, and their performance may be sensitive to gravity and acceleration. Examples of complex valve and sensor control schemes can be found in U.S. Pat. No. 6,349,554.

Liquid pumps have also been combined with arterial heat pipes to improve the heat carrying capacity of heat pipes. For example, the U.S. Pat. Nos. 4,470,450 and 4,898,231 utilize external liquid pumps, which are serially connected between the condensers and evaporators of loop-type heat pipe assemblies. The systems utilize a plurality of discrete valves and sensors to maintain the pressure balance in the systems and prevent the flooding of the evaporators. The complexity of the control system results in increased system cost, size and weight, and decreased system reliability and endurance.

It would therefore be desirable to have a heat transfer device that has the simplicity, reliability and cost advantages of passive devices such as heat pipes, loop heat pipes and capillary pumped loops, and the high heat flux and large heat carrying capacities of actively pumped and pump assisted devices.

SUMMARY OF THE INVENTION

The present invention is directed to a heat transfer loop system that is capable of removing high heat fluxes and transporting large amounts of heat over great distances, and uses passive means to regulate the flows and achieve pressure balances in the system. The heat transfer loop system, including a primary passive two-phase flow segment and a secondary actively pumped liquid flow segment, is hereafter referred to as a hybrid loop. The primary passive two-phase flow segment of the hybrid loop further consists of an evaporator, a condenser, a liquid reservoir, a vapor transport line connecting the evaporator and the condenser, and a liquid transport line connecting the condenser and the liquid reservoir. The evaporator is typically attached to a waste heat generating component, and the condenser is typically attached to a heat sink that is at a lower temperature than the heat source. The heat input from the heat source vaporizes the working fluid in the evaporator. The vapor is driven towards the condenser via the vapor transport line by the pressure gradient caused by the temperature difference between the evaporator and condenser. In the condenser, the vapor condenses and releases the latent heat of vaporization to the cooler heat sink. The condensed liquid is driven towards the liquid reservoir via the liquid transport line, again by the higher vapor pressure developed in the evaporator.

The secondary actively pumped liquid segment of the hybrid loop connects the liquid reservoir and the evaporator, completing the fluid circulation in the loop. The secondary actively pumped liquid segment uses a liquid pump to draw liquid from the liquid reservoir into the evaporator of the primary passive two-phase flow segment. A portion of the liquid supplied into the evaporator is vaporized by the heat input from the heat source and moves into the primary segment, while the excess liquid is pumped back to the liquid reservoir.

In one embodiment, the evaporator in the primary two-phase flow segment consists of a porous wick in which one or more liquid arteries are formed. The structure thus formed is a liquid transport artery with porous walls. The pumped liquid flows through the liquid arteries. The capillary force in the porous wick draws the liquid from the arteries into and through the porous wick to sustain the evaporation. Excess liquid is pumped through the arteries back to the reservoir. The porous wick is designed to ensure that the capillary force will be sufficient in preventing the vapor in the evaporator from penetrating into the liquid arteries or the liquid in the arteries from moving into the vapor space. The relatively high speed liquid flow through the arteries sweeps away vapor bubbles that may form inside the arteries at high heat flux input conditions. The two-phase flow balancing, control and separation are all realized passively and reliably by the capillary force in the evaporator porous wick. No valves or sensors are required for the flow management.

In a preferred embodiment of the invention, the evaporator porous wick is formed of bonded powders of distributed sizes. The bonded powder wick may be fabricated by sintering, brazing, or pressing the powders together, or by using an adhesive bonding material such as glass or plastic. Wicks having distributed pore sizes are more tolerant of boiling inside the wicks and can consequently handle higher heat fluxes.

In another embodiment, the evaporator porous wick has porous grooves. The liquid arteries may be encased in the peak regions of the porous lands that are relatively far away from the heat input surface, which reduces the heating of the liquid inside the arteries and consequently the probability of vapor bubble formation in the arteries.

In another embodiment, the evaporator porous wick has regions made of coarser powders and other regions made of finer powders. The graded wick pore sizes are particularly useful in minimizing the liquid flow resistance in the wick while maximizing the capillary force in the wick.

In one embodiment, the liquid arteries are made of micro or nano-perforated tubing, slotted tubing, or mesh screen tubing. In another embodiment, the wall of the liquid artery may have layers of bonded powders with graded pore sized to minimize liquid resistance through the porous wall and maximize the capillary force in the porous wall.

In another embodiment, the liquid arteries are made of metallic, ceramic, glass or plastic materials. The use of materials with a low thermal conductivity offers particular benefit in reduced heating of the liquid inside the arteries. Overheating of the liquid inside the artery may cause boiling inside the artery, consequently increasing the flow pressure drop.

In one embodiment, the arteries in the evaporator porous wick may be connected in parallel, in a manifold type configuration, or the arteries may be connected in series.

In one embodiment, the liquid pump is submerged in the liquid reservoir, which helps with the pump priming and reduces the probability of pump cavitation.

In another embodiment, the liquid pump and reservoir assembly is formed integrally with the evaporator to provide a compact system. The flow channel supplying the liquid into the evaporator and the liquid artery in the evaporator porous wick form a co-axial bayonet configuration to facilitate the compact flow arrangement.

In one embodiment, multiple evaporators are connected with a single liquid line that supplies the arteries each in turn with a series connection.

In another embodiment, multiple evaporators are connected with multiple liquid lines from one or more pumps that supply the evaporators with parallel flow.

In another embodiment, the vapor spaces of multiple evaporators are connected to equalize the vapor pressure and temperature.

In a preferred embodiment, a single evaporator is connected with multiple liquid lines and multiple pumps, with adjacent arteries supplied from different pumps. The liquid flow rate can be adjusted to provide redundant cooling. If one pump fails, liquid for the evaporator near the failed artery is supplied by the adjacent arteries supplied by different pumps.

BRIEF DESCRIPTION OF THE DRAWINGS

FIG. 2b illustrates a hybrid loop, which incorporates the evaporator configuration of FIG. 2a;

DETAILED DESCRIPTION

As used herein, the term "hybrid loop" refers to the heat transfer loop system that includes a primary passive two-phase flow segment and a secondary actively pumped liquid flow segment. The terms "bonded powder", "powder wick" and "porous wick" refer to any means of bonding metal, ceramic, glass or plastic powder or fiber materials together to form a porous wick structure, including, but not limited to, sintering, diffusion bonding, hot pressing, brazing, soldering, and bonding with plastic or glass. The term "condenser" means a portion of a two-phase device or a discrete component connected thereto, in which a vapor-phase working fluid condenses to liquid-phase as the latent heat of vaporization is transferred to an associated heat sink. The term "evaporator" means a portion of a two-phase device or a discrete component connected thereto, in which evaporation of a liquid-phase working fluid occurs as the fluid absorbs heat from an associated heat source.

Figure 1A:
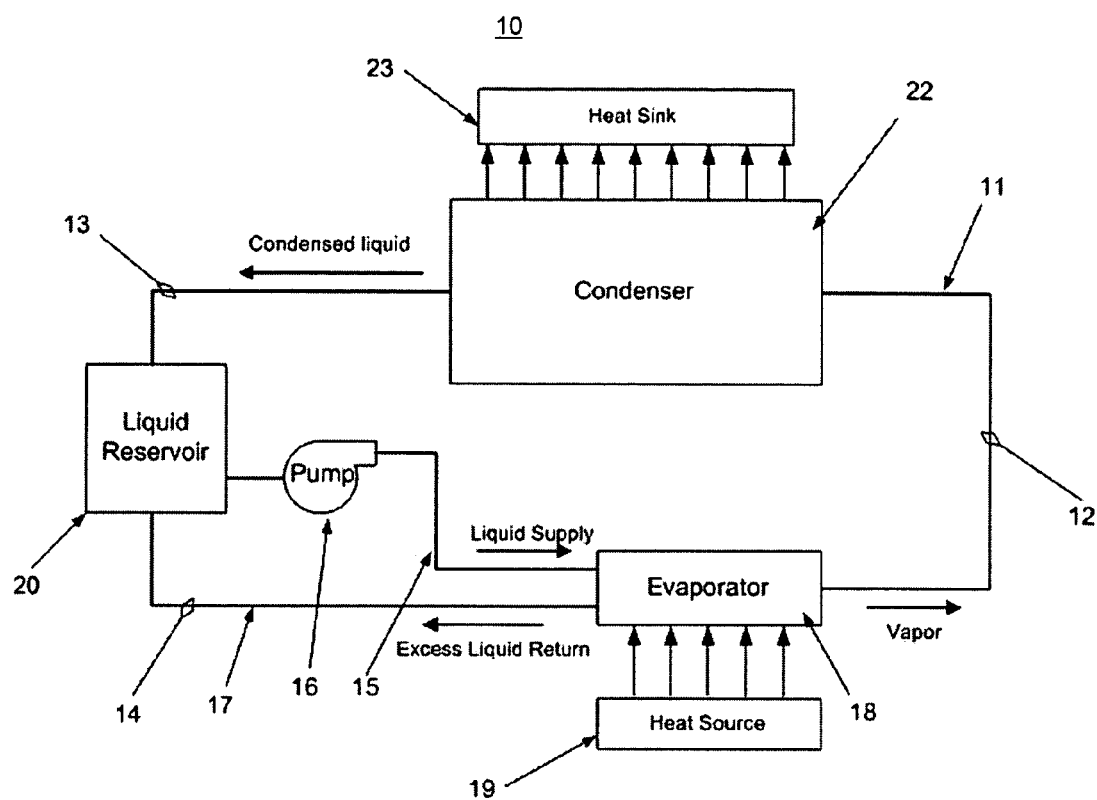
FIG. 1a is a schematic diagram of a hybrid loop having a primary passive two-phase flow segment and a secondary actively pumped liquid flow segment, according to the invention.

FIG. 1a illustrates a hybrid loop 10 according to a preferred embodiment of the invention. The hybrid loop 10 includes a primary passive two-phase flow segment 12 including an evaporator 18, a condenser 22 and a liquid reservoir 20 linked by vapor and liquid transport lines 11 and 13, and a secondary actively pumped liquid segment 14 including a liquid pump 16 and the associated liquid supply line 15 and excess liquid return line 17. The evaporator 18, is exposed to a heat source 19, and the condenser 22 is exposed to a heat sink 23. The temperature of the heat sink 23 must be lower than the temperature of the heat source 19 for the hybrid loop 10 to function.

Referring to FIG. 1a, the heat input from the heat source 19 causes evaporation of a liquid-phase working fluid maintained in the evaporator. The working fluid may be water, ammonia, methanol, liquid metals, cryogenic fluids, or refrigerants, depending on the temperature of the application. The vapor-phase working fluid with its absorbed heat load (i.e. latent heat of vaporization) is driven towards the condenser 22 through the vapor transport line 11, by the vapor pressure gradient between the evaporator 18 and condenser 22 caused by the temperature difference between the heat source 19 and heat sink 23. In the condenser 22, the vapor condenses as the latent heat is transferred to the cooler heat sink 23. The condensed working fluid is then driven to the liquid reservoir 20 in liquid phase through the liquid transport line 13, again by the higher vapor pressure in the evaporator 18.

Referring still to FIG. 1a, the secondary actively pumped liquid segment 14 includes a liquid pump 16 that draws the liquid from the liquid reservoir 20 into the evaporator 18, through the liquid supply line 15. A portion of the liquid is vaporized in the evaporator 18 by the heat input from the heat source 19, while the excess liquid is pumped back to the liquid reservoir 20 through the excess liquid return line 17.

Figure 1B:
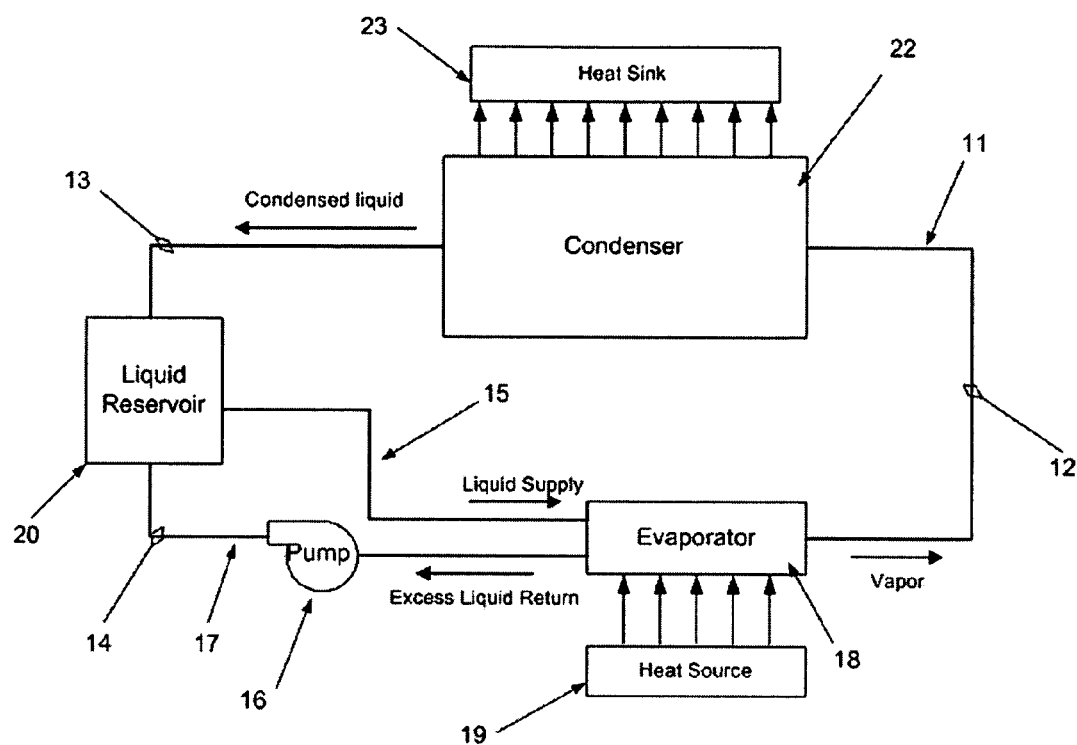
FIG. 1b is a schematic of the hybrid loop where the liquid pump is alternately located at the downstream of the evaporator.

FIG. 1b illustrates a different location for the liquid pump 16. The liquid pump 16 is located downstream of the evaporator 18. The suction side of the liquid pump 16 is connected to the liquid outlet of the evaporator 18.

Figure 2A:
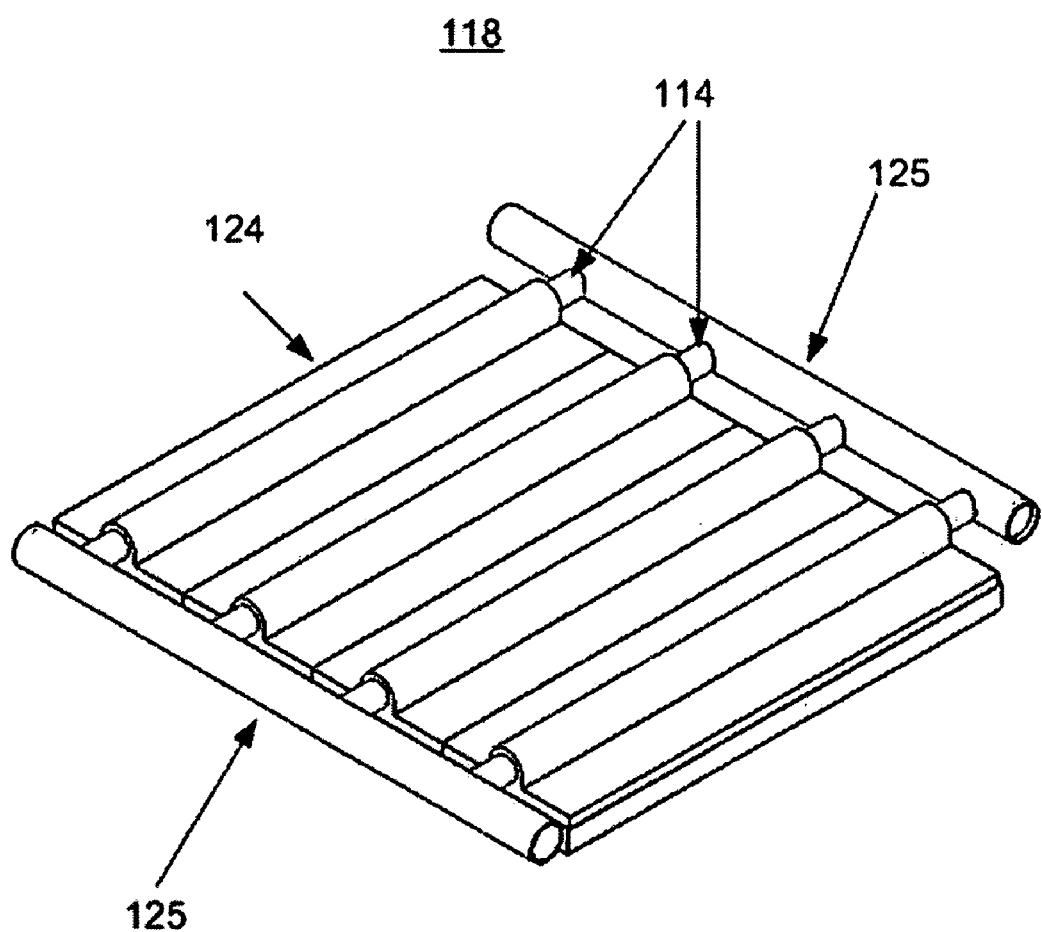
FIG. 2a illustrates an evaporator configuration in the primary passive two-phase flow segment, which has a porous wick that encases multiple, parallel arteries with manifolds at the two ends, according to an embodiment of the invention.

The amount of liquid-phase fluid supplied to the evaporator must be sufficient to avoid dry out in the evaporator, but not too great as to result in flooding in the evaporator. This delicate balance is advantageously achieved through the use of an evaporator configuration defined by one or more liquid arteries encased in a porous wick, wherein the liquid arteries accommodate the excess liquid flow in the evaporator. FIG. 2a illustrates an exemplary embodiment of the evaporator 118 wherein the porous wick 124 encases multiple, parallel liquid arteries 114 which are linked by manifolds 125 provided at the two ends of the liquid arteries.

The porous wick 124 of the evaporator 118 provides a capillary medium, which dominates the gravity and acceleration effects. Thus, the foregoing evaporator configuration demonstrates a reduced sensitivity to gravity and acceleration effects. The porous wick 124 additionally provides numerous micro surfaces to enhance nucleate boiling, resulting in improved phase change heat transfer. It will be appreciated that the geometric shape and pore radii profile of the porous wick 124 can be optimized to further improve the heat transfer. The porous wick 124 may be made of any bonded metal, ceramic, glass or plastic powders or fibers, using techniques commonly known to those skilled in the art, and preferably is a porous metal structure formed of sintered metal powders.

The liquid arteries 114 may be formed of micro or nano-perforated or slotted tubing, tubular mesh screens, bonded powders or any combination thereof. Preferably, the bonded powder wick structure defines pore radii in the range of about 0.5 microns to 1 mm. It will be appreciated that the size, position and number of the liquid arteries 114 may be varied to suit particular requirements.

Figure 2B:
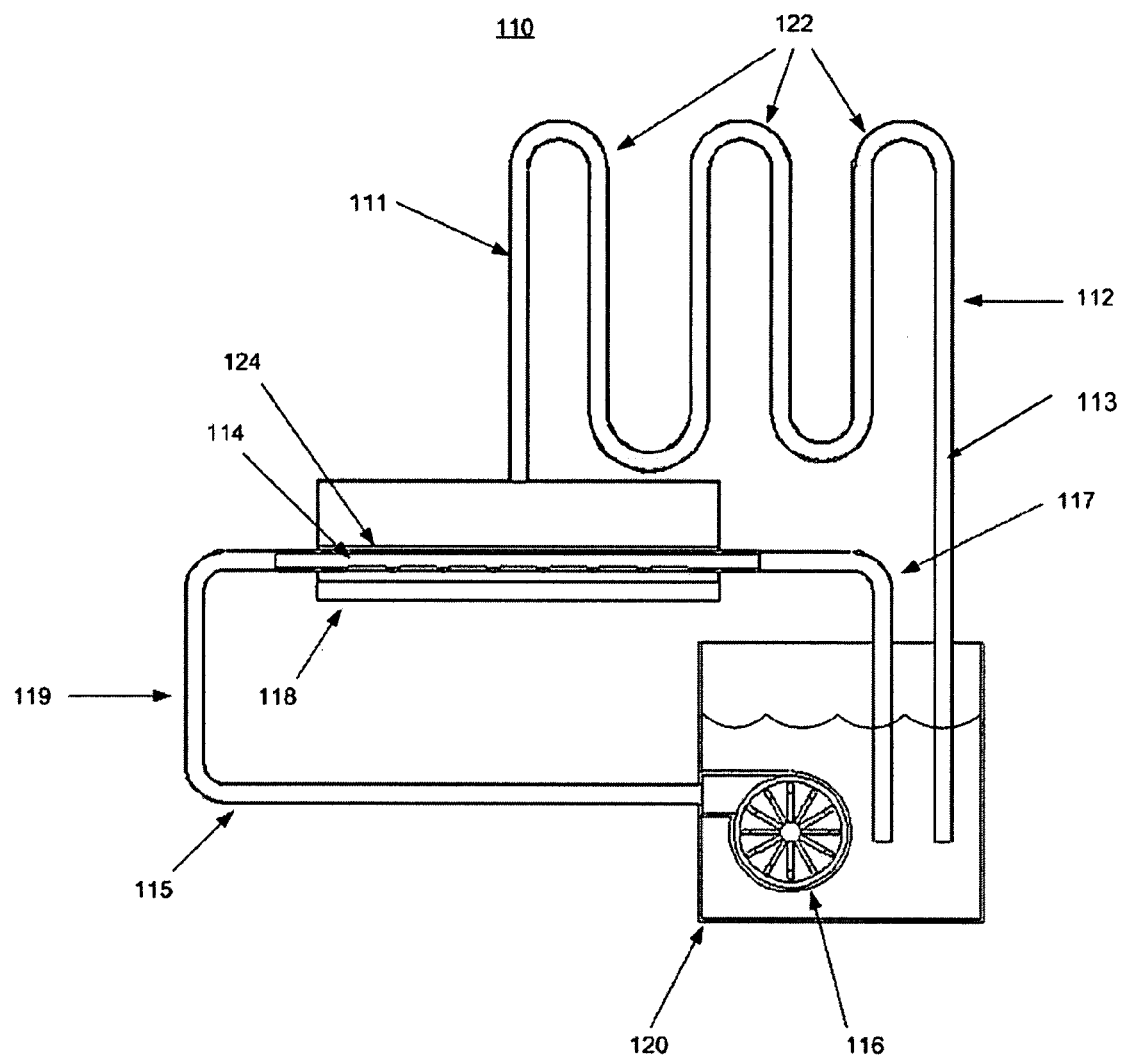

FIG. 2b shows a hybrid loop 110 incorporating the evaporator configuration of FIG. 2a. The hybrid loop 110 includes a primary passive two-phase flow segment 112 including an evaporator 118, a condenser 122 and a liquid reservoir 120; and a secondary actively pumped liquid flow segment 119 including a liquid pump 116 submerged in the liquid reservoir 120. Submerging the liquid pump 116 in the liquid reservoir 120 helps with the pump priming and reduces pump cavitations. The liquid artery 114 encased in the porous wick 124 in the evaporator 118 is connected to the liquid supply line 115 and the excess liquid return line 117 to accommodate the pumped liquid flow.

Referring to FIG. 2b, the capillary force in the porous wick 124 draws the liquid through perforations provided in the walls of the liquid arteries 114 and distributes the liquid within the porous wick 124 to sustain the evaporation. Excess liquid is driven out of the evaporator 118 through the liquid arteries 114 and eventually pumped back to the liquid reservoir 120 by the liquid pump 116.

Referring still to FIG. 2b, the vapor phase working fluid generated inside the evaporator 118 flows through the vapor transport line 111 towards the condenser 122 for heat dissipation. The condensed liquid may be sub cooled in the condenser 122 and is driven towards the liquid reservoir 120 through the liquid transport line 113.

It is critically important to have a porous wick structure 124 that has sufficient capillary force to separate the liquid inside the liquid arteries and the vapor. The porous wick must be able to prevent the vapor from penetrating into the arteries and the liquid from moving into the vapor space.

It is critically important to have a liquid pressure inside the liquid artery 114 that is lower than the vapor pressure in the evaporator 118, to prevent the liquid from coming out of the liquid artery 114 to flood the vapor space of the evaporator 118. This is achieved by maintaining the temperature of the liquid reservoir 120 lower than the temperature of the vapor in the evaporator 118 and locating the liquid pump 116 downstream of the evaporator 118. These two design features ensure the liquid pressure in the artery 114 is always lower than the vapor pressure in the evaporator 118.

Referring still to FIG. 2b, the interior volume of the liquid reservoir 120 must be sufficient to accommodate the volume of the liquid working fluid in the entire system and the volume of the liquid pump 116.

Figure 3:
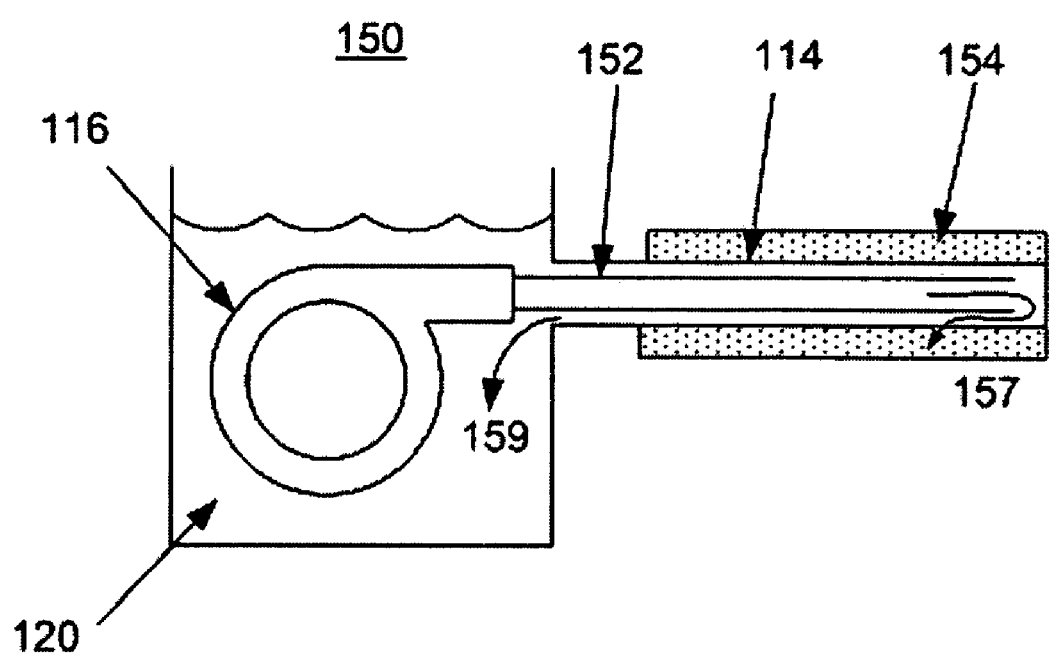
FIG. 3 illustrates an evaporator configuration utilizing a co-axial bayonet-type liquid artery and a submerged pump in the reservoir, according to another embodiment of the invention.

FIG. 3 illustrates an alternative evaporator configuration 150 utilizing a co-axial bayonet-type liquid inlet and outlet design and a submerged pump 116 in the reservoir 120. Liquid is sucked from the reservoir 120 through the liquid supply line 152 inside the liquid artery 114 where it exits the end of the liquid supply line 152 and reverses direction of flow, traveling back along the exterior of liquid supply line 152 and interior of the liquid artery 114. Liquid flowing back along the interior of the liquid artery 114 is extracted by the capillary force through the porous wicking structure 154 in a path generally indicated by arrow 157. The liquid is dispersed through the wick structure 154 for evaporation. Excess liquid flows back to the liquid reservoir 120 in a flow path generally indicated by arrow 159.

FIGS. 4–13 illustrate several alternative embodiments of the porous wick and the associated liquid arteries of the evaporator, which will now be described in further detail.

Figure 4:
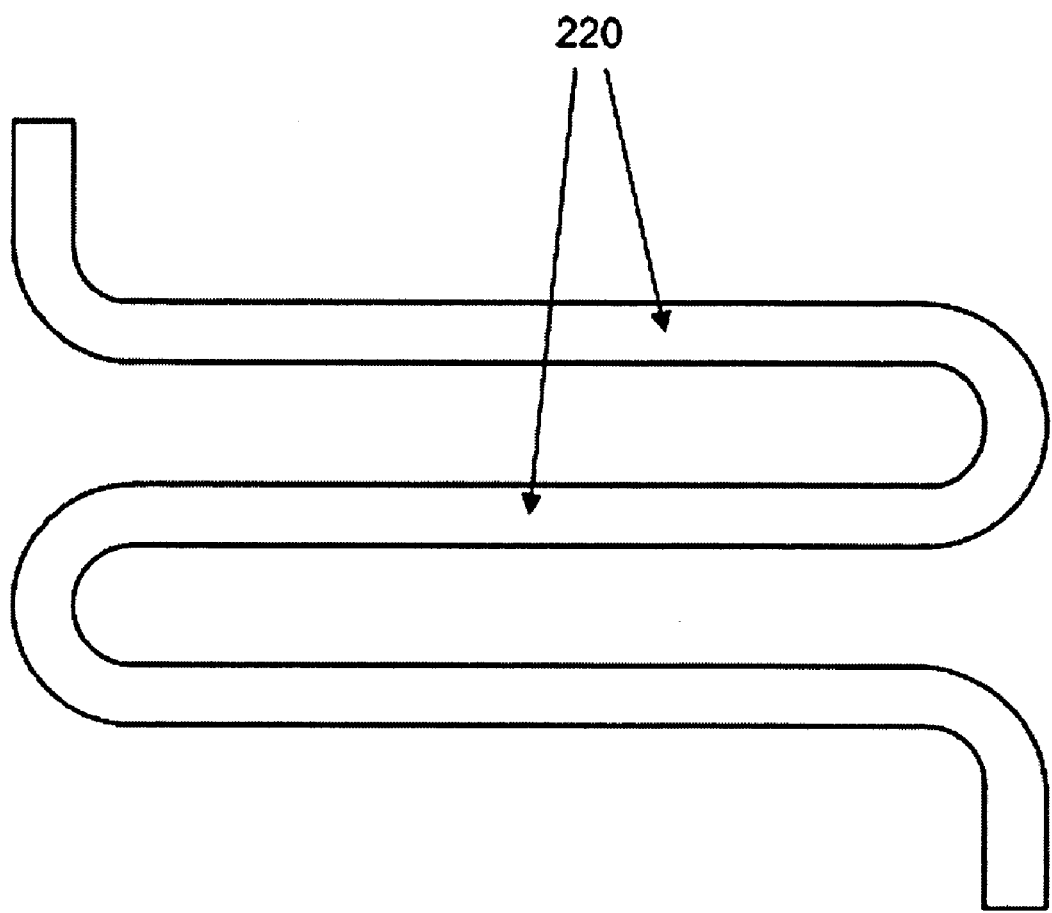
FIG. 4 illustrates an in-series artery configuration for an evaporator, according to another embodiment of the invention.

FIG. 4 illustrates one embodiment of a liquid artery segment. Multiple arteries 220 are configured in a serpentine in-series configuration to eliminate the flow imbalance that may occur in a parallel configuration as illustrated in FIG. 2a.

Figure 5:
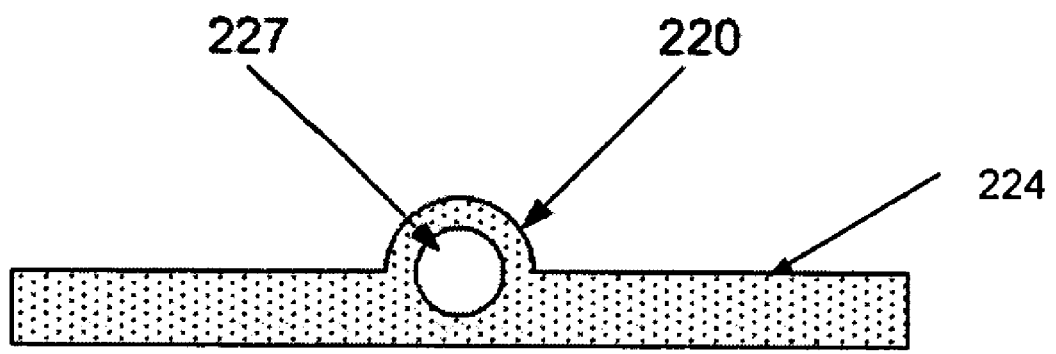
FIG. 5 is a cross-sectional view of an artery formed of bonded powders, according to the invention.

FIG. 5 shows a cross-sectional view of a liquid artery 220 that is formed of bonded powders, according to the invention. The bonded powders form the wall 227 of the artery 220. The porous wall allows the liquid to be drawn into the evaporator porous wick 224, while preventing the vapor pressure from penetrating into the artery 220. The liquid artery 220 can be the same bonded powders as used in the evaporator porous wick 224.

Figure 6:
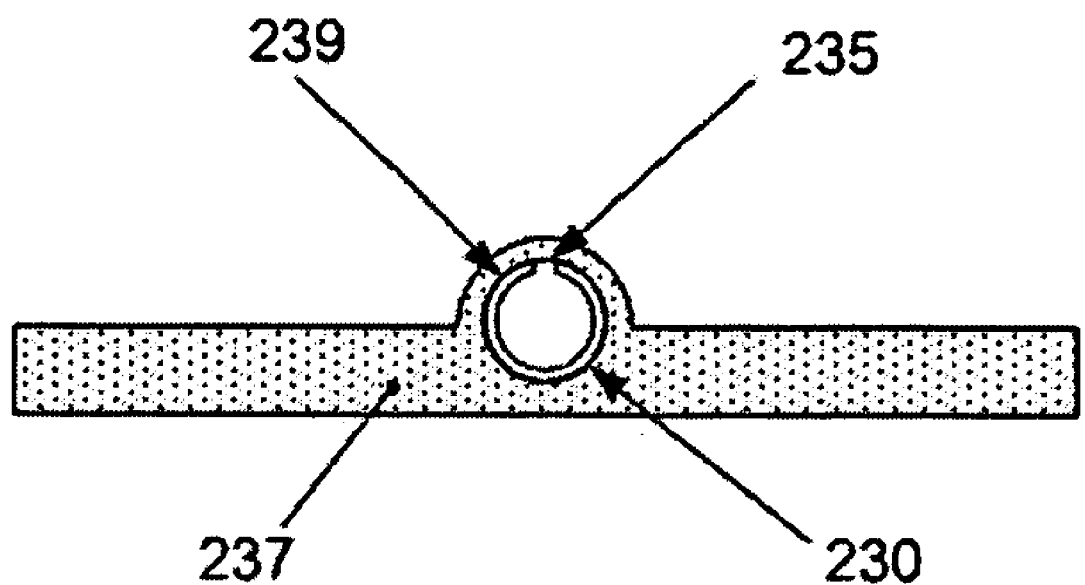
FIG. 6 is a cross-sectional view of an artery formed of bonded powders encompassing a perforated tube, according to another embodiment of the invention.

FIG. 6 illustrates a variation of the artery design, where the artery 230 is made of a solid-wall tubing 239 having micro or nano-perforations 235. The artery 230 is encased in the evaporator porous wick 237 that is made of bonded powders. The artery 230 is preferably formed of a metal or ceramic material.

Figure 7:
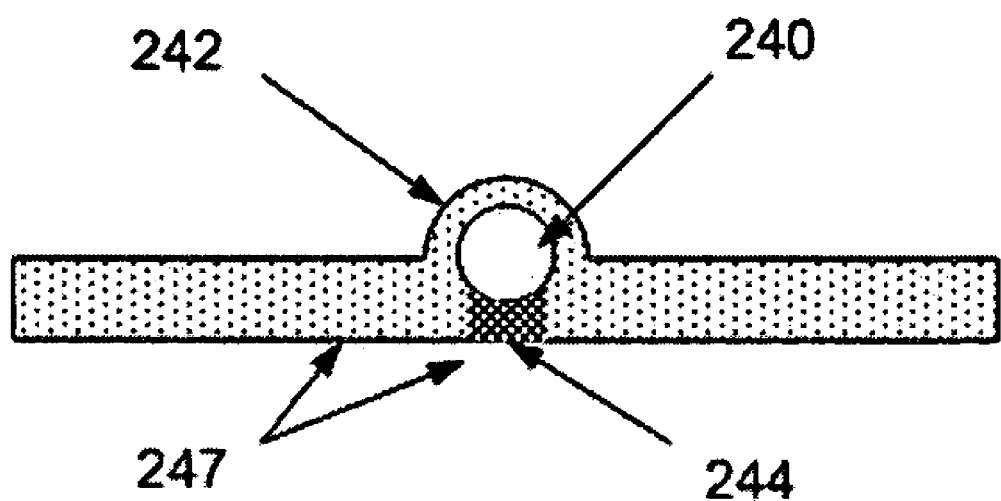
FIG. 7 is a cross-sectional view of an artery formed of bonded coarse and fine powders, according to another embodiment of the invention.

FIG. 7 illustrates an artery 240 that is formed of bonded powders 247 having varying powder sizes. The fine pore, outer layer 244 provides large capillary forces to separate the liquid inside the artery 240 and the vapor outside of the artery 240 which are at large pressure differentials. The coarse layer 242 reduces flow resistance to the liquid across the artery wall supplying the evaporator porous wick 247.

Figure 8:
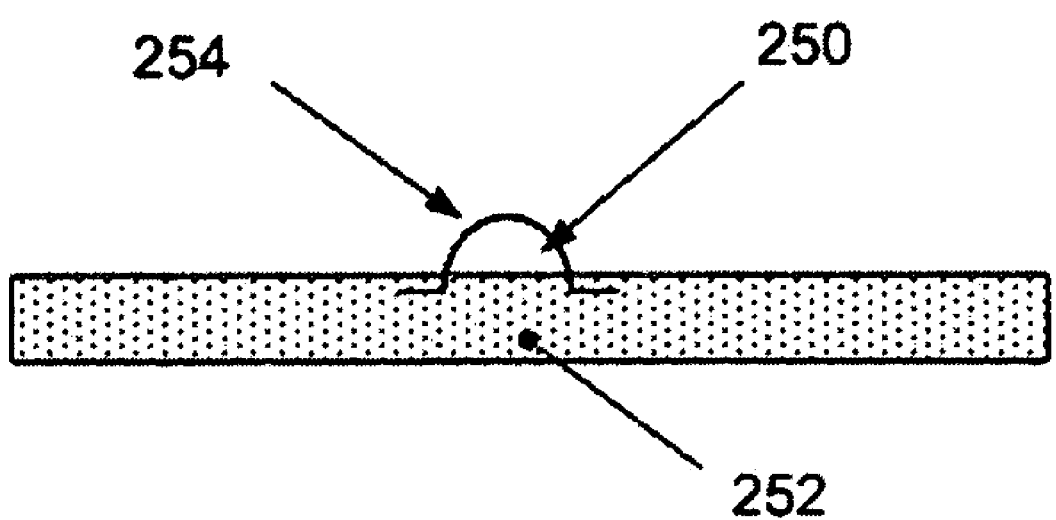
FIG. 8 is a cross-sectional view of an artery formed by securing an elongated U-shaped fine mesh screen to a base formed of bonded powders, according to another embodiment of the invention.

FIG. 8 is a cross-sectional view of an artery 250 formed by securing an elongated U-shaped mesh screen 254 to an evaporator porous wick 252 formed of bonded powders, according to another embodiment of the invention.

Figure 9:
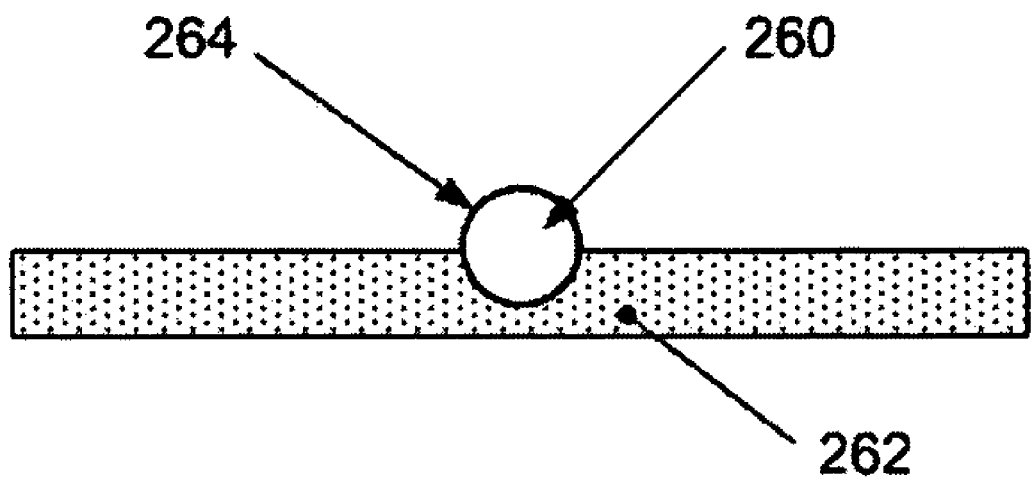
FIG. 9 is a cross-sectional view an artery formed by securing an elongated micro or nano-perforated tube or tubular screen to a base formed of bonded powders, according to another embodiment of the invention.

FIG. 9 is a cross-sectional view of an artery 260 formed by securing an elongated micro or nano-perforated tube or tubular screen 264 to an evaporator porous wick 262 formed of bonded powders, according to another embodiment of the invention.

Figure 10:
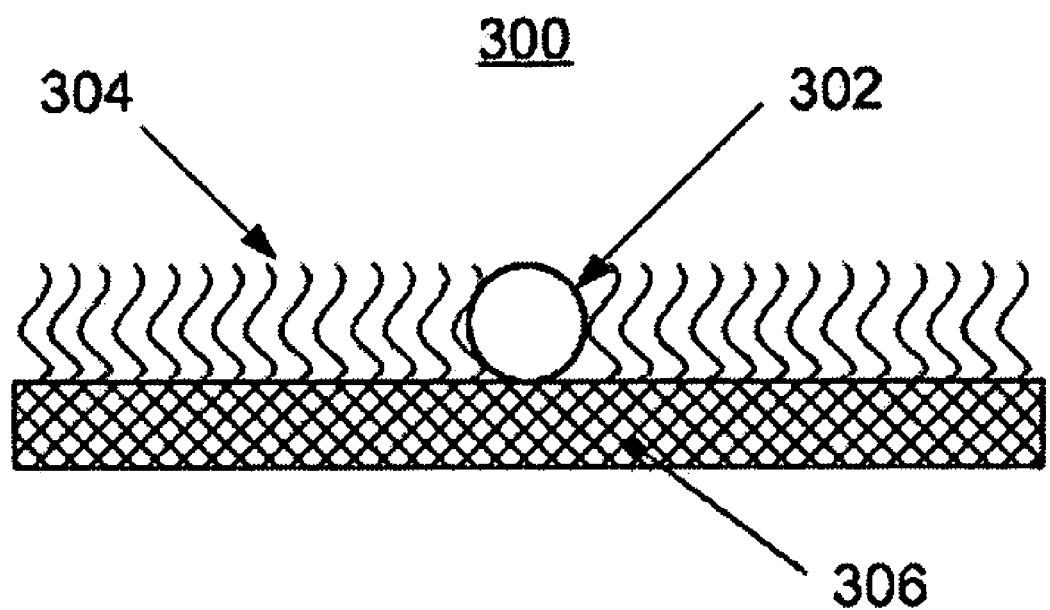
FIG. 10 is a cross-sectional view of an artery in a hair-like evaporator wick structure, according to another embodiment of the invention.

FIG. 10 is a cross-sectional view of an artery configuration 300, which includes a micro or nano-perforated tube or mesh screen 302 secured to an evaporator porous wick containing hair-like capillary structures or nano-fibers 304, which may be formed by gluing nano-fibers to the substrate 306 or growing the nano-fibers by plating techniques. The nano-fibers preferably have a length of between 20 and 1,000 microns.

Figure 11:
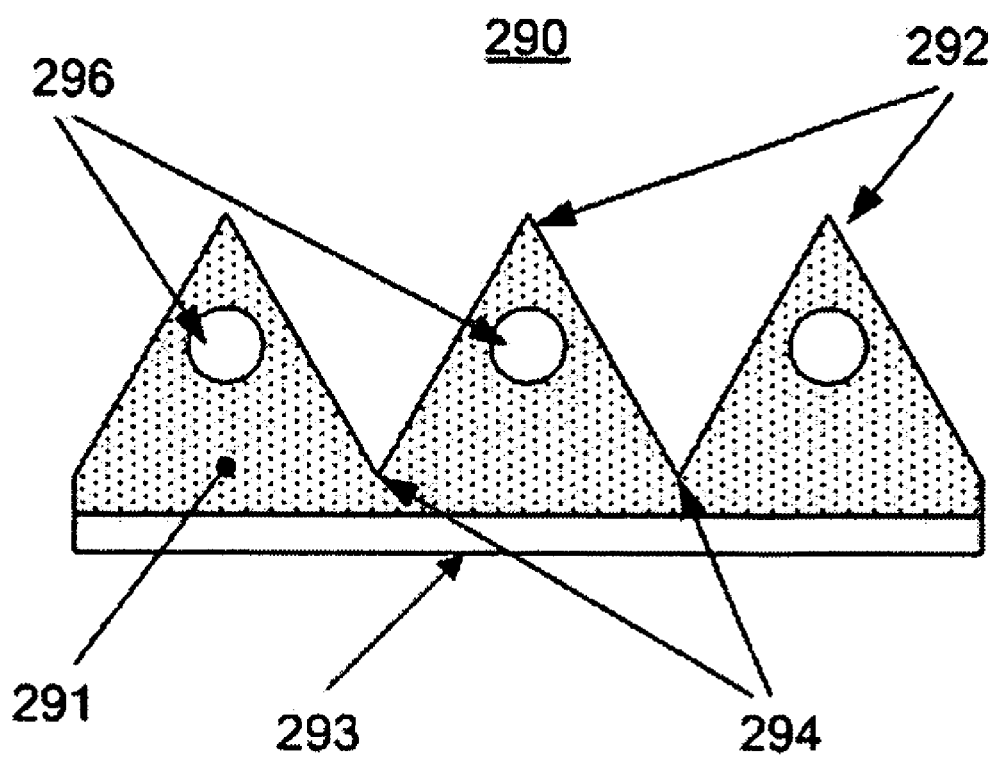
FIG. 11 is a cross-sectional view of an evaporator porous wick having porous grooves, with arteries encased in the peak regions of the porous lands, according to another embodiment of the invention.

FIG. 11 illustrates that an evaporator porous wick 290 having porous grooves. The liquid arteries 296 are encased in the peak regions 292 of the porous lands to minimize the heating of the arteries 296 from the heat input surface 293. The porous grooves 294 provide increased evaporation surfaces and shorter vapor venting passages into the vapor space from the wick interior 291. The porous grooves can be made into various shapes and dimensions to suit particular applications.

Figure 12:
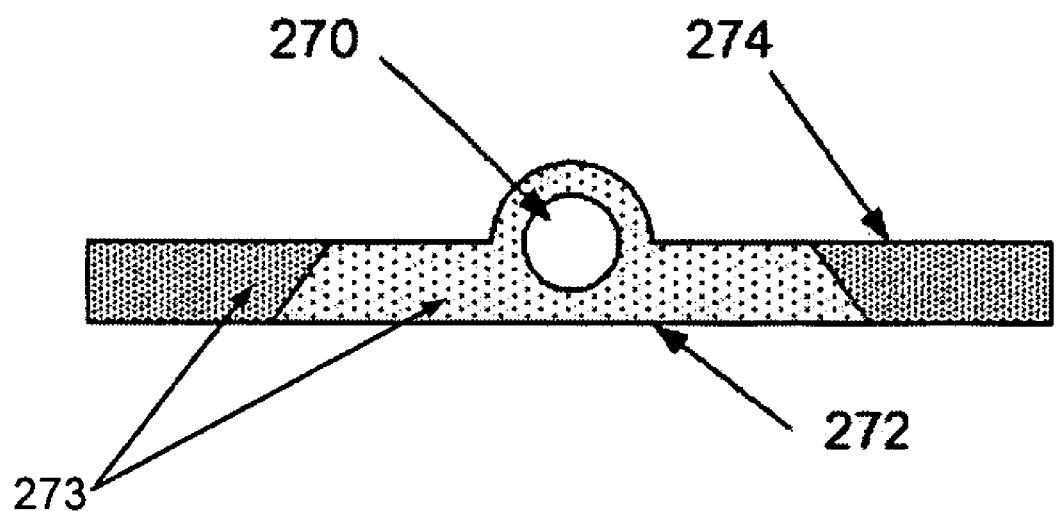
FIG. 12 is a cross-sectional view of an evaporator porous wick having coarse powders in some regions and fine powders in other regions, with an artery encased in the porous wick, according to another embodiment of the invention.

FIG. 12 shows a cross-sectional view of an artery 270 encased in a porous wick 273, according to an embodiment of the invention. The bonded powder materials may be homogeneous, or alternatively, the bonded powders may be graded. That is, the bonded powders may selectively include regions of relatively coarse powders 274 and regions of relatively fine powders 272 to minimize the flow resistance and maximize the capillary force. Examples of acceptable bonded powder metals include brazed metal powders, hot pressed powdered metals, plastic bonded powder metals, injection molded or extruded powder metals and double-shot injection molded powder metals. Acceptable bonded ceramic powders may include metallized and brazed ceramics, hot pressed ceramics, plastic-bonded ceramics and glass or vitreous bonded ceramics. Examples of porous plastics include injection molded plastics, and double-shot injection molded plastics (useful for providing graded porous properties).

Figure 13:
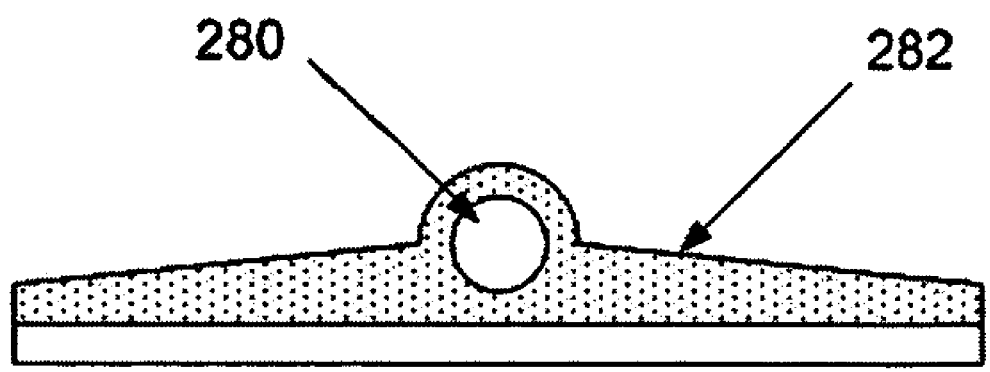
FIG. 13 is a cross-sectional view of an evaporator porous wick having a tapered cross-section, with an artery encased in the porous wick, according to another embodiment of the invention.

FIG. 13 is a cross-sectional view of an artery 280 encased in a porous wick 282 having a tapered cross-section, according to another embodiment of the invention. The tapered cross-section increases the evaporative surface area of the porous wick 282 and shortens vapor venting passages. It will be appreciated that other geometric variations may be employed to achieve similar effects and are likewise contemplated within the scope of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A hybrid loop comprising:
   a. an evaporator component having:
      i. an exterior surface exposed to a heat source;
      ii. an interior cavity having a porous wick, one or more liquid arteries encased inside the porous wick, and a vapor space, wherein the porous wick extracts liquid from the liquid arteries by capillary action as needed to sustain the evaporation of the liquid working fluid from the porous wick, and the capillary forces in the porous wick are sufficient to separate the vapor phase working fluid inside the vapor space and the liquid phase working fluid inside the liquid artery;
      iii. an inlet for admitting the liquid phase working fluid into the liquid arteries;
      iv. a first outlet for exit of the vapor phase working fluid from the vapor space; and
      v. a second outlet for exit of excess liquid phase working fluid from the porous wick;
   b. a condenser component having:
      i. an exterior surface exposed to a heat sink at a lower temperature than the said heat source;
      ii. an interior space in which the vapor phase working fluid from the said evaporator component condenses into liquid phase;
      iii. an inlet for admitting the vapor phase working fluid; and
      iv. an outlet for exit of the condensed liquid phase working fluid;
   c. a liquid reservoir having:
      i. an interior space for storing the liquid phase working fluid;
      ii. a first inlet for admitting the condensed liquid phase working fluid;
      iii. a second inlet for admitting the excess liquid phase working fluid; and
      iv. an outlet for exit of the liquid phase working fluid;
   d. a liquid pump having:
      i. an inlet for admitting the liquid phase working fluid;
      ii. an outlet for discharging the liquid phase working fluid at an elevated pressure;
      iii. wherein the liquid pump draws liquid phase working fluid from the liquid reservoir into the liquid arteries in the evaporator;
      iv. wherein the liquid phase working fluid drawn by the liquid pump into the said liquid arteries is in excess of the requirements of evaporation in the evaporator; and
      v. wherein the excess liquid phase working fluid in the liquid arteries is further driven by the liquid pump into the liquid reservoir;
   e. a vapor transport line connecting the first outlet of the evaporator and the inlet of the condenser;
   f. a liquid transport line connecting the outlet of the condenser and the first inlet of the liquid reservoir;
   g. a first liquid supply line connecting the outlet of the liquid reservoir and the inlet of the liquid pump;
   h. a second liquid supply line connecting the outlet of the liquid pump and the inlet of the evaporator;
   i. an excess liquid return line connecting the second outlet of the evaporator and the second inlet of the liquid reservoir.

2. The hybrid loop of claim 1 in which the porous wick in the evaporator is formed of bonded powder.

3. The hybrid loop of claim 2 wherein the bonded powder is formed from at least one of metal, ceramic, glass and plastic powders.

4. The hybrid loop of claim 2 wherein the bonded powder has a grooved shape.

5. The hybrid loop of claim 4 wherein the porous wick has liquid arteries encased in peak regions of porous lands.

6. The hybrid loop of claim 4 wherein the porous wick has different dimensions at different locations.

7. The hybrid loop of claim 2 wherein the bonded powder includes regions of relatively coarse bonded powders and regions of relatively fine bonded powders.

8. The hybrid loop of claim 1 in which the porous wick in the evaporator comprises at least one mesh screen.

9. The hybrid loop of claim 8 wherein the mesh screens have one or more layers.

10. The hybrid loop of claim 9 comprising a plurality of mesh screens wherein the mesh screens have different pore sizes between the layers and at different locations of each layer.

11. The hybrid loop of claim 1 in which the porous wick in the evaporator is formed of micro or nano wires.

12. The hybrid loop of claim 11 in which the micro or nano wires are bonded to the surface of the evaporator.

13. The hybrid loop of claim 11 in which the said micro or nano wires are plated to the surface of the evaporator.

14. The hybrid loop of claim 1 in which the porous wick comprises any combination of the bonded powder, mesh screen and longitudinal grooves in the wall of the said evaporator.

15. The hybrid loop of claim 1 wherein the liquid artery has a porous wall with capillary properties, permitting the liquid phase working fluid to be drawn into the porous wick by capillary action in the porous wick while preventing the vapor from penetrating into the liquid artery.

16. The hybrid loop of claim 15 wherein the porous wall of the liquid artery is made of one or more slot openings in the wall of the liquid artery.

17. The hybrid loop of claim 15 wherein the porous wall of the liquid artery is a micro or nano porous material.

18. The hybrid loop of claim 17 wherein the micro or nano porous material is one of sintered powders, brazed powders, pressed powders, glued powders, and mesh screen.

19. The hybrid loop of claim 15 in which the porous wall of the liquid artery has a distribution of pore sizes.

20. The hybrid loop of claim 1 wherein the liquid artery is in contact with the porous wick.

21. The hybrid loop of claim 1 wherein the liquid artery is partially encased by the porous wick.

22. The hybrid loop of claim 1 wherein the liquid artery is fully encased by the porous wick.

23. The hybrid loop of claim 1 wherein the liquid artery consists of multiple, parallel branches.

24. The hybrid loop of claim 23 wherein the multiple, parallel branches are connected to a common liquid manifold at each end.

25. The hybrid loop of claim 23 wherein the multiple, parallel branches are connected to each other into a serpentine configuration.

26. The hybrid loop of claim 1 wherein the liquid pump is located in the liquid reservoir.

27. The hybrid loop of claim 1 wherein the liquid reservoir and liquid pump are integrated with the evaporator.

28. The hybrid loop of claim 1 wherein the liquid supply line and the liquid artery form a co-axial bayonet.

29. The hybrid loop of claim 28 wherein the liquid supply line is inside the liquid artery.

30. The hybrid loop of claim 29 wherein a space between the exterior of the liquid supply line and the interior of the liquid artery forms the excess liquid return line.

31. The hybrid loop of claim 1 wherein the first and second liquid supply lines are combined into one liquid supply line connecting the outlet of the liquid reservoir and the inlet of the evaporator.

32. The hybrid loop of claim 31 wherein the excess liquid return line is divided into first and second excess liquid return lines.

33. The hybrid loop of claim 32 wherein the first excess liquid return line connects the second outlet of the evaporator and the inlet of the liquid pump.

34. The hybrid loop of claim 32 wherein the second excess liquid return line connects the outlet of the liquid pump and the second inlet of the liquid reservoir.

35. The hybrid loop of claim 1 wherein the evaporator consists of multiple, discrete sub evaporators.

36. The hybrid loop of claim 35 wherein a single liquid line supplies the arteries in the multiple sub evaporators.

37. The hybrid loop of claim 35 wherein multiple liquid lines supply the arteries in the multiple sub evaporators.

38. The hybrid loop of claim 35 wherein the vapor spaces in the multiple sub evaporators communicate with each other through vapor lines.

39. The hybrid loop of claim 1 wherein the liquid pump consists of multiple liquid pumps.

40. The hybrid loop of claim 1 wherein the liquid artery has changing cross-sectional dimensions along its length.

41. The hybrid loop of claim 1 wherein the liquid supply line and excess liquid return line has valves for flow control.

* * * * *